US011032951B2

(12) United States Patent
Alawieh et al.

(10) Patent No.: US 11,032,951 B2
(45) Date of Patent: Jun. 8, 2021

(54) ELECTRONIC SYSTEM COMPRISING AN ELECTRONIC MODULE

(71) Applicant: INSTITUT VEDECOM, Versailles (FR)

(72) Inventors: Hadi Alawieh, Massy (FR); Menouar Ameziani, Guyancourt (FR)

(73) Assignee: INSTITUT VEDECOM, Versailles (FR)

( * ) Notice: Subject to any disclaimer, the term of this patent is extended or adjusted under 35 U.S.C. 154(b) by 0 days.

(21) Appl. No.: 16/764,309

(22) PCT Filed: Nov. 15, 2018

(86) PCT No.: PCT/FR2018/052841
§ 371 (c)(1),
(2) Date: May 14, 2020

(87) PCT Pub. No.: WO2019/097164
PCT Pub. Date: May 23, 2019

(65) Prior Publication Data
US 2020/0375061 A1    Nov. 26, 2020

(30) Foreign Application Priority Data

Nov. 17, 2017 (FR) ...................................... 1760846

(51) Int. Cl.
*H05K 7/20* (2006.01)
*H01L 25/07* (2006.01)
(Continued)

(52) U.S. Cl.
CPC ........... *H05K 7/209* (2013.01); *H01L 25/072* (2013.01); *H01L 25/112* (2013.01); *H01L 25/50* (2013.01); *H05K 7/20936* (2013.01)

(58) Field of Classification Search
CPC .. H05K 1/0206; H05K 1/0204; H05K 1/0203; H05K 7/209; H05K 1/020936; H01L 25/112; H01L 25/072; H01L 25/50
See application file for complete search history.

(56) References Cited

U.S. PATENT DOCUMENTS 5,703,753 A * 12/1997 Mok .................... H01L 23/4006
174/16.3
5,923,084 A * 7/1999 Inoue .................. H01L 23/3121
257/712
(Continued)

FOREIGN PATENT DOCUMENTS

JP     2006134990 A     5/2006
JP     2010287707 A    12/2010

OTHER PUBLICATIONS

International Search Report for PCT/FR2018/052841 dated Mar. 11, 2019.
Written Opinion for PCT/FR2018/052841 dated Mar. 11, 2019.

*Primary Examiner* — Adam B Dravininkas
(74) *Attorney, Agent, or Firm* — Sandberg Phoenix & von Gontard, P.C.

(57) ABSTRACT

The invention relates to a three-dimensional electronic module comprising an electronic device housed between a first substrate and a second substrate, said first and second substrates being electrically and/or thermally connected to one another by at least one and preferably two heat bridges added onto and rigidly connected to said first and second substrates. The invention also relates to an electronic system comprising at least two electronic modules mounted facing one another so as to sandwich a third substrate in contact with the second substrate thereof, respectively. The third substrate is configured to provide thermal and electrical coupling between the two electronic modules via the second substrate (140) thereof.

12 Claims, 3 Drawing Sheets

(51) Int. Cl.
  *H01L 25/11* (2006.01)
  *H01L 25/00* (2006.01)

(56) References Cited

U.S. PATENT DOCUMENTS

| | | | | |
|---|---|---|---|---|
| 7,554,039 | B2* | 6/2009 | Yokozuka | H01L 23/3677 |
| | | | | 174/252 |
| 10,002,821 | B1* | 6/2018 | Hoegerl | H01L 23/4334 |
| 2009/0194862 | A1* | 8/2009 | Kitami | H01L 23/4334 |
| | | | | 257/690 |
| 2013/0258736 | A1 | 10/2013 | Higuchi et al. | |
| 2014/0232016 | A1 | 8/2014 | Ohno et al. | |
| 2014/0327127 | A1* | 11/2014 | Hable | H01L 23/4334 |
| | | | | 257/712 |
| 2015/0361218 | A1* | 12/2015 | Lee | C12P 19/26 |
| | | | | 524/440 |
| 2016/0005675 | A1* | 1/2016 | Tong | H01L 23/4334 |
| | | | | 257/675 |
| 2016/0126157 | A1* | 5/2016 | Jeon | H01L 23/043 |
| | | | | 257/693 |
| 2016/0282067 | A1* | 9/2016 | Aston | B32B 9/047 |
| 2016/0286692 | A1* | 9/2016 | Aston | H01L 23/42 |
| 2017/0311457 | A1* | 10/2017 | Kubota | B60R 16/03 |

\* cited by examiner

ELECTRONIC SYSTEM COMPRISING AN ELECTRONIC MODULE

CROSS-REFERENCE TO RELATED APPLICATIONS

This application is the US National Stage under 35 USC § 371 of International Application No. PCT/FR2018/052841, filed Nov. 15, 2018 which claims priority to French App. No. 1760846 filed on Nov. 17, 2017, the content (text, drawings and claims) of both said applications being incorporated here by way of reference.

TECHNICAL FIELD

The present invention relates to an electronic module as used in the field of power electronics. The invention also relates to an electronic power system comprising an electronic module of this kind, and to a method for producing an electronic power system of this kind.

BACKGROUND

Power electronic modules are present in numerous fields of activity, in particular in the field of transportation. In view of the desired energy transition towards renewable energy sources that release fewer $CO_2$ emissions, these power electronic modules are called upon to address growing financial and technological requirements. Within the field of transportation, the automotive industry in particular is subject to very strict rules on pollutant emissions; these rules are leading to a tangible technological shift, in particular through the electrification of vehicles, the architecture of which may be hybrid or fully electric. Additionally, making airplane engines hybrid is another topical issue in terms of reducing $CO_2$ emissions.

Conventionally, power modules are built by arranging their various electronic components in a planar manner: the rear faces of the electronic components are attached to a conductive substrate, and interconnection wires (or "bonding wires") establish electrical connections between the front faces of the electronic components and the electrical system in which the power modules are integrated. In order to guarantee optimum functioning, the substrate ensures both an electrical function in order to supply the electronic components with electricity, and also a thermal interface function so as to limit the temperature rise of the power module as a result of its operation.

While this conventional planar architecture is functional, it is not optimal in terms of compactness and cost, and it has other disadvantages too. For instance, the different electronic components of the power module are cooled via only one of their faces. In addition, the stray inductances, introduced in particular by the bonding wires and the electrical-connection tapes, generate overvoltages, which increase the heat released and are particularly damaging, or even destructive, for the power module. Lastly, the stray inductances created by the planar architectures counteract higher switching frequencies of the power module even though the frequencies are advantageous for compactness, in particular in power converters.

Also known are power modules that propose a three-dimensional architecture in which the various electronic components can be positioned one on top of the other in order to increase the compactness of the power modules and reduce the stray inductances. In this case, the various electronic components are not simply distributed on the surface of a body, but rather they are distributed within a volume that extends from the body. This advantageous configuration thus makes it possible to reduce the production costs, but it does increase the thermal stresses, in particular at the level of various electronic components, the spatial proximity of which leads to steeper temperature gradients.

Three-dimensional power modules of this kind can be cooled via their two opposite faces, as described in particular in US 2016/0005675 A1. In this case, each of the faces of the power module is coupled to a heat sink, and the two heat sinks are thermally coupled to each other by means of a thermal bridge positioned laterally with respect to the electronic components.

The disadvantage of a power module of this kind is sub-optimal or insufficient cooling when such power modules are assembled together to form more complex electronic systems. Additionally, the configuration of the power module and its thermal bridge may lead to problems with assembly and to extra costs during production.

An object of the present invention is to address the aforementioned problems at least to a large extent, and to further create additional advantages by proposing a new electronic module that makes it possible to optimize the dissipation of the heat produced during the operation of the module.

Another object of the present invention is to reduce the production costs for an electronic module of this kind.

Another object of the present invention is to improve the reliability and service life of an electronic module system of this kind.

SUMMARY OF THE INVENTION

According to a first aspect of the invention, at least one of the aforementioned objects is achieved by an electronic module comprising:
  a first heat-conducting substrate;
  a second electrically conductive substrate;
  an electronic device arranged between the two substrates;
  at least one thermal bridge designed to transfer heat between the first substrate and the second substrate.

In the electronic module according to the first aspect of the invention, the at least one thermal bridge is separate from the two substrates.

In other words, the at least one thermal bridge of the electronic module according to the first aspect of the invention is mounted on and rigidly attached to each substrate. Thus, unlike the known prior art, the at least one thermal bridge is not integrally formed with the two substrates, thereby facilitating the use of the electronic module according to the first aspect of the invention, and in particular the production thereof and the integration of its various components, in particular the electronic device.

This advantageous configuration thus makes it possible to ensure transfers of heat between the first and second substrates of the electronic module according to the first aspect of the invention, by means of the at least one thermal bridge. Preferably, the at least one thermal bridge is designed to optimize a transfer of heat from the first substrate to the second substrate of the electronic module according to the first aspect of the invention.

As a result, the electronic module according to the first aspect of the invention is more reliable and robust.

The electronic device of the electronic module according to the first aspect of the invention is mechanically and electrically coupled to the first substrate and the second substrate so as to form an electronic module of the three-dimensional type, as described above.

Advantageously, the electronic module according to the first aspect of the invention may comprise at least one of the improvements set out below; the technical features forming these improvements can be taken either alone or in combination:

- the electronic module according to the first aspect of the invention comprises at least one connection stud designed to establish an electrical and/or thermal connection between at least one connection terminal of the electronic device and the second substrate. This configuration makes it possible to facilitate the electrical interconnection of the electronic device and/or its electronic components as described below;
- the connection stud comprises a base on which at least two contact terminals are positioned, each contact terminal being designed to establish an electrical connection with a corresponding connection terminal of the electronic device. In general, the connection stud comprises a base on which at least one contact terminal is positioned, each contact terminal being designed to establish an electrical connection with a corresponding connection terminal of the electronic device;
- the contact terminals project from a prismatic extension of the connection stud. In other words, each contact terminal has a prismatic or frustoconical shape and extends beyond the prismatic extension of the connection stud;
- at their free end, the contact terminals form a connection surface intended to be rigidly connected, possibly by means of a bonding material, to a corresponding terminal of the electronic device. Preferably, the connection surfaces of the contact terminals are planar, and preferably coplanar. Advantageously, the connection stud comprises two contact terminals, each contact terminal having a connection surface;
- in order to establish an electrical and/or thermal connection to the second substrate, the connection stud comprises an electrical-connection face positioned at an opposite end from the contact terminals of the connection stud. The electrical-connection face is advantageously planar. Preferably, the electrical-connection face is parallel to at least one of the contact terminals of the connection stud;
- the connection stud comprises an electrical-connection tab projecting with respect to a face of the connection stud. The electrical-connection tab thus makes it possible to facilitate the electrical connection of the electronic device to the second substrate, and in particular to electrically connect one connection terminal of the electronic device to the connection stud;
- the connection stud is advantageously metal so as to favor electrical conduction. Preferably, the connection stud is made of a material comprising copper;
- the electronic module according to the first aspect of the invention comprises an electrical connector, known under the term "bonding," between the connection tab of the connection stud and a connection terminal of the electronic device;
- the first substrate of the electronic module according to the first aspect of the invention comprises (i) an electrical insulator, (ii) a first electrically conductive coating positioned on a first side of the electrical insulator, the first side being positioned on an opposite side from the electronic device in relation to the first substrate, and (iii) a second electrically conductive coating positioned on a second side of the electrical insulator, the second side being positioned on the electronic-device side;
- the first and/or second electrically conductive coating of the first substrate is metal. Preferably, the first and/or second electrically conductive coating of the first substrate is/are made of a material comprising copper. In particular, the first substrate takes the form of a DBC (direct bonded copper) substrate. Optionally, the first substrate takes the form of a DBA (direct bonded aluminum) substrate;
- the electrical insulator of the first substrate advantageously takes the form of a dielectric plate made of an electrically insulating material, such as a ceramic or polyimide;
- the second electrically conductive coating of the first substrate comprises (i) a first portion and a second portion, each first and second portion being electrically insulated from one another at the level of the second electrically conductive coating of the first substrate, and (ii) a middle portion positioned between the first and second portions and electrically insulated from the first and second portions at the at the level of the second electrically conductive coating of the first substrate;
- the first portion, the second portion and the middle portion of the second electrically conductive coating of the first substrate are advantageously all planar and/or all coplanar with one another;
- the middle portion of the second conductive coating of the first substrate comprises an electrical-connection lug projecting laterally out from the first substrate;
- the electrical-connection lug of the middle portion of the second conductive coating of the first substrate has a polygonal shape, and in particular a rectangular or square shape;
- the electrical-connection lug of the middle portion of the second conductive coating of the first substrate comprises a through-opening in order to facilitate the connection of an electrical-connection wire. The through-opening is advantageously circular and/or the through-opening is positioned at a center of the electrical-connection lug;
- the second substrate comprises an electrically conductive coating, a first face of the second substrate positioned on the electronic-device side being at the same electrical potential as a second face of the second substrate positioned on the side opposite from the electronic device in relation to the second substrate;
- the electrically conductive coating of the second substrate is metal. Preferably, the electrically conductive coating of the second substrate is made of a material comprising copper;
- the electrically conductive coating of the second substrate comprises (i) a first portion and a second portion, each first and second portion being electrically coupled to one another at the electrically conductive coating of the second substrate, and (ii) a middle portion positioned between the first and second portions and electrically coupled to the first and second portions at the electrically conductive coating of the second substrate;
- the middle portion of the conductive coating of the second substrate comprises an electrical-connection lug projecting laterally out from the second substrate;
- the electrical-connection lug of the middle portion of the conductive coating of the second substrate has a polygonal shape, and in particular a rectangular or square shape;

the electrical-connection lug of the middle portion of the conductive coating of the second substrate comprises a through-opening in order to facilitate the connection of an electrical-connection wire. The through-opening is advantageously circular and/or the through-opening is positioned at a center of the electrical-connection lug;

the electrical-connection lug of the middle portion of the conductive coating of the second substrate extends in a lateral direction opposite to the electrical-connection lug of the middle portion of the first substrate;

the second substrate comprises attachment means intended to make it possible to rigidly attach two electronic modules according to the first aspect of the invention;

the attachment means of the second substrate takes the form of through-openings positioned on each first and second portion of the conductive coating of the second substrate, each through-opening being positioned on an attachment lug that projects laterally with respect to the corresponding first and second portions;

each first and second portion of the conductive coating of the second substrate comprises two attachment lugs that project laterally with respect to a longitudinal extension edge of the second substrate;

the at least one thermal bridge comprises (i) a first thermal bridge positioned between the first portion of the second conductive coating of the first substrate and the first portion of the conductive coating of the second substrate, and (ii) a second thermal bridge positioned between the second portion of the second conductive coating of the first substrate and the second portion of the conductive coating of the second substrate;

each thermal bridge of the electronic module according to the first aspect of the invention is rigidly attached to the first substrate and to the second substrate of the electronic module. In particular, each end of the at least one thermal bridge in contact with the first substrate and second substrate is brazed to the first substrate and the second substrate, respectively;

each at least one thermal bridge is made of a heat-conducting material. The heat-conducting material is preferably selected from among those having a thermal conductivity coefficient greater than or equal to 20 W/m/K at 20° C. In particular, but in a non-limiting manner, the material forming each at least one thermal bridge is metal, such as copper or aluminum;

the electronic module according to the first aspect of the invention comprises a first heat sink thermally coupled to the first substrate. The thermal coupling between the first substrate and the first heat sink is of the direct or indirect thermal coupling type, in particular by means of an intermediate material positioned between the first heat sink and the first substrate, the intermediate material being of the heat-conducting type, for example a thermal paste;

the heat sink comprises a plurality of fins that extend in an opposite direction to the electronic device in relation to the first substrate;

the heat sink is made of a heat-conducting material. The heat-conducting material is preferably selected from among those having a thermal conductivity coefficient greater than or equal to 20 W/m/K at 20° C. In particular, but in a non-limiting manner, the material forming the heat sink is metal, such as aluminum;

the electronic device of the electronic module according to the first aspect of the invention is arranged so as to operate like a switch, the electronic device being designed to be able to assume at least (i) a conducting ON-state, in which the electronic device is equivalent to a closed circuit, and (ii) a conducting OFF-state, in which the electronic device is equivalent to an open circuit;

the electronic device of the electronic module according to the first aspect of the invention comprises at least one power component, such as a power transistor, in particular of the MOSFET type (metal oxide semiconductor field effect transistor), an IGBT (insulated-gate bipolar transistor) or a GTO (gate turn-off thyristor).

According to a second aspect of the invention, an electronic power system is proposed, comprising:

a first and a second electronic module according to any of the preceding claims;

a third substrate thermally and electrically coupled to:
  the second substrate of the first electronic module; and
  the second substrate of the second electronic module.

Advantageously, the electronic power system according to the second aspect of the invention may advantageously comprise at least one of the improvements set out below; the technical features forming these improvements can be taken either alone or in combination:

the third substrate takes the form of a plate. In particular, the third substrate is made of a heat-conducting and electrically conductive material. The heat-conducting material is preferably selected from among those having a thermal conductivity coefficient greater than or equal to 20 W/m/K at 20° C. Preferably, but in a non-limiting manner, the material forming the third substrate is metal, such as aluminum or copper;

the third substrate comprises an electrical-connection lug projecting laterally out from the third substrate. Advantageously, the electrical-connection lug of the third substrate has a polygonal shape, and in particular a rectangular or square shape. Further advantageously, the electrical-connection lug of the third substrate is positioned in a middle position with respect to a longitudinal extension of the third substrate;

the electrical-connection lug of the third substrate comprises a through-opening in order to facilitate the connection of an electrical-connection wire. The through-opening is advantageously circular and/or the through-opening is positioned at a center of the electrical-connection lug of the third substrate;

the third substrate of the electronic power system according to the second aspect of the invention comprises complementary attachment means that interact with the attachment means of the first and second substrates so as to rigidly attach the two electronic modules of the electronic power system;

the complementary attachment means of the third substrate takes the form of through-openings positioned on either side of the electrical-connection lug, each through-opening being positioned on an attachment lug that projects laterally with respect to the corresponding first and second portions. In particular, the third substrate of the electronic power system according to the second aspect of the invention comprises two pairs of attachment lugs which project laterally with respect to a longitudinal extension edge of the second substrate, each pair of attachment lugs being positioned on a longitudinal edge of the third substrate;

the third substrate comprises a device for conveying heat from a hot point to a cold point;

the heat conveying device of the electronic system according to the second aspect of the invention comprises at least one heat pipe passing through the third substrate from a first end to a second end. In particular, according to a first alternative embodiment, the at least one heat pipe passes through the third substrate of the electronic system between two longitudinal ends of the third substrate, the at least one heat pipe extending longitudinally between the longitudinal ends. According to a second alternative embodiment, the at least one heat pipe passes through the third substrate between two lateral ends of the third substrate, the at least one heat pipe extending laterally between the lateral ends;

the electronic device of each electronic module forms a half-bridge of an inverter arm, the half-bridge of the first electronic module being electrically connected to the corresponding half-bridge of the second electronic module at an intermediate point. In particular, the intermediate point connecting the corresponding half-bridges of each electronic module is an equipotential point connecting a first terminal of the power component of the first electronic module to a second terminal of the second power component of the second electronic module. Even more particularly, in the case where the power component takes the form of a transistor, the first terminal of the power component is advantageously a source terminal and the second terminal of the power component is a drain terminal.

According to a third aspect of the invention, a method for assembling a electronic power system according to the second aspect of the invention or according to any of the improvements thereof is proposed, the assembly method comprising the following steps:

for each electronic module:
  producing the electronic device on the first substrate of the electronic module;
  placing and attaching the at least one thermal bridge onto the first substrate of the electronic module;
  placing and attaching the second substrate onto the at least one thermal bridge and the electronic device;
inserting the third substrate in an intermediate position between two electronic modules that form a pair and are positioned on either side of the third substrate, the third substrate being sandwiched between the two electronic modules that form the pair;
rigidly connecting the third substrate to the electronic modules.

By way of non-limiting example, the first and/or second electronic module may be produced by means of lithography techniques, in particular to produce the electronic device on the first and/or second substrate.

Advantageously, the third substrate may be rigidly connected to the electronic modules by means of any attachment means, and in particular by means of a screw and nut system that interacts with the attachment lugs of each electronic module and as described above.

Different embodiments of the invention are provided which include the various optional features set out herein, according to all their possible combinations.

DESCRIPTION OF THE DRAWINGS

Other features and advantages will again become clear from the following description and from various embodiments given by way of non-limiting illustration with reference to the accompanying drawings, in which.

Figure 1A:
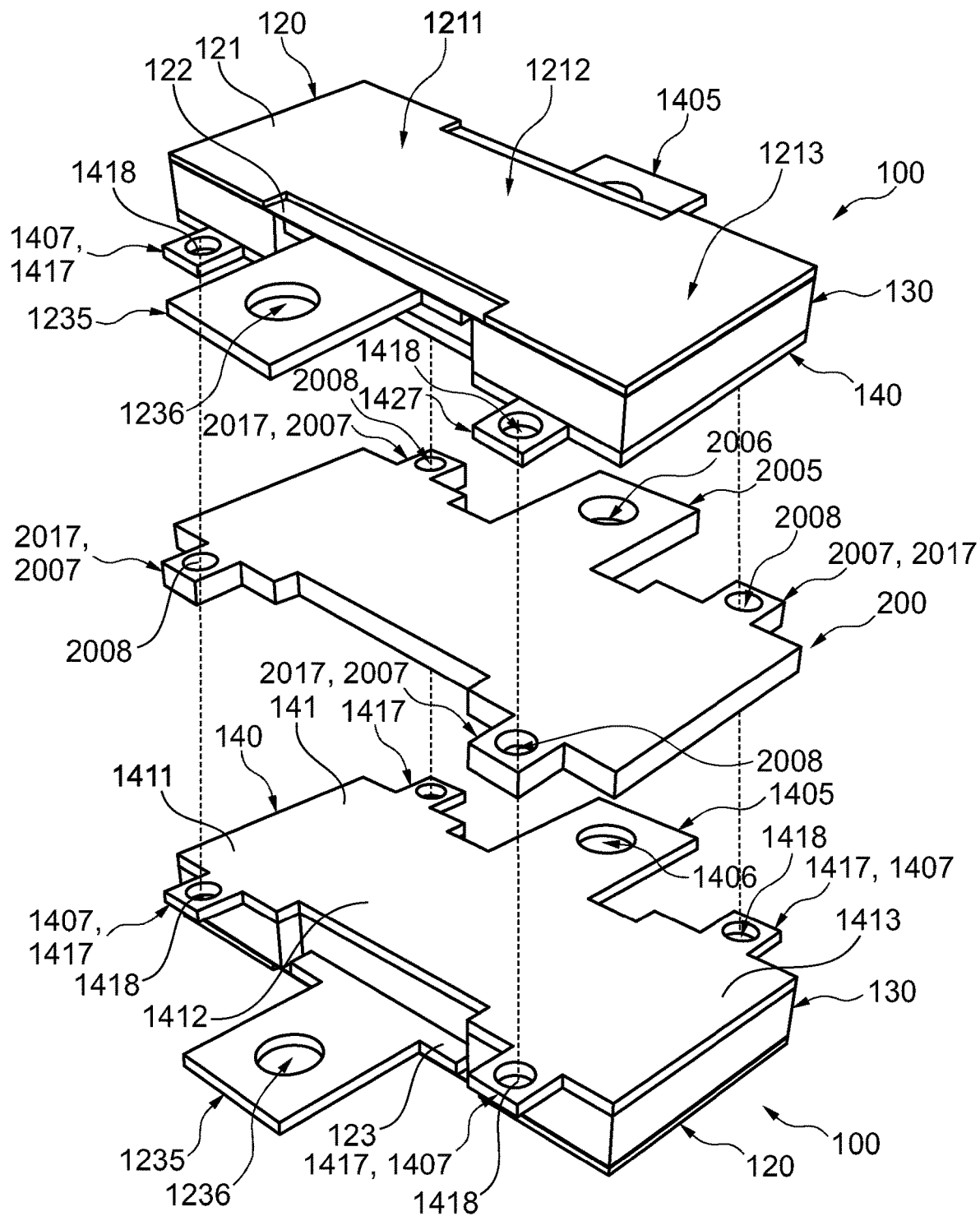
FIG. 1A illustrates an exploded perspective view of an embodiment of an electronic system according to the second aspect of the invention and comprising two electronic modules according to the first aspect of the invention.

It goes without saying that the features, variants and different embodiments of the invention may be combined with one another in various combinations, unless they are incompatible with one another or mutually exclusive. Variants of the invention that only include a selection of the features described below in isolation from the other described features are conceivable as long as that selection of features is sufficient to impart a technical advantage or to distinguish the invention in relation to the prior art.

In particular, all the variants and embodiments described may be combined unless anything prohibits such combination in technical terms.

In the drawings, elements appearing in several figures retain the same reference numeral.

DETAILED DESCRIPTION OF THE INVENTION

In the following description and in the claims, the following terms will be used in a non-limiting manner and in order to aid understanding:

"longitudinal:" in a direction parallel to the longest extension of the electronic module and/or the electronic system, a longitudinal end of the electronic module and/or the electronic system representing an edge of the electronic module and/or the electronic system when viewed in the direction parallel to the longest extension of the module/system;

"lateral" or "transverse:" in a direction perpendicular to the longest extension of the electronic module and/or the electronic system, a transverse end of the electronic module and/or the electronic system representing an edge of the electronic module and/or the electronic system when viewed in the direction perpendicular to the longest extension of the module/system. In the accompanying drawings, the longitudinal direction and the lateral direction together form a horizontal plane.

With reference to FIGS. 1A, 1B, 2A and 2B, an embodiment of an electronic system 10 according to the second aspect of the invention is now described, as well as an electronic module 100 according to the first aspect of the invention. However, where the electronic module 100 is described in the context of the electronic system 10 in the figures, the features described for the electronic module 100 are independent of the inclusion thereof in the electronic system 10.

In accordance with the second aspect of the invention, the electronic system 10 described in the drawings comprises:
  a first and a second electronic module 100; and
  a third substrate 200 thermally and electrically coupled to both a second substrate 140 of the first electronic module 100 and a second substrate 140 of the second electronic module 100.

In the example shown in the various figures, the electronic system 10 comprises two electronic modules 100 symmetrically mounted around the third substrate 200, such that the third substrate 200 is sandwiched between the two electronic modules at the respective second substrates 140 thereof.

In particular, the third substrate 200 takes the form of a plate, preferably made of a heat-conducting and electrically conductive material, such as a metal material, for example copper or aluminum.

Figure 2A:
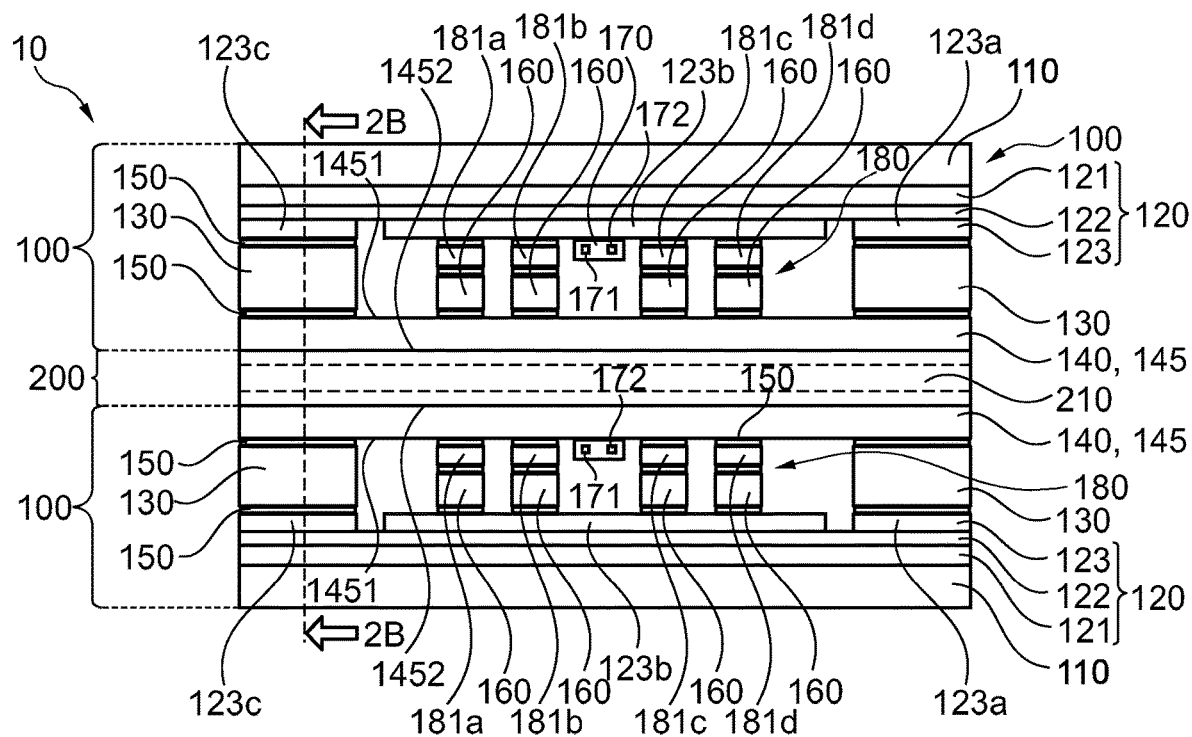
FIG. 2A illustrates a longitudinal sectional view of the electronic system shown in FIG. 1B.
Figure 2B:
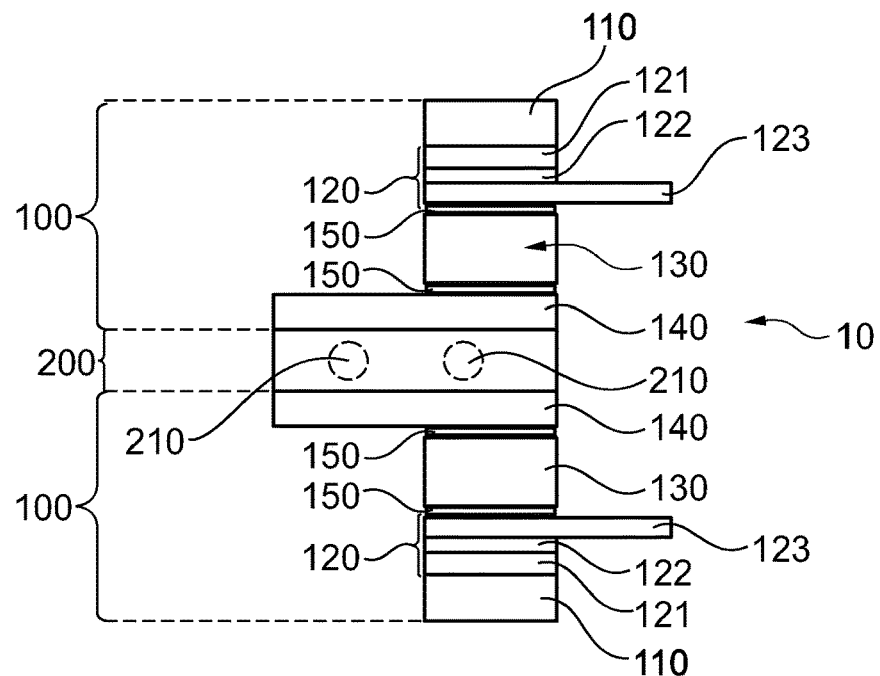
FIG. 2B illustrates a cross-sectional view of the electronic system shown in FIG. 1B.

The third substrate 200 also comprises a heat conveying device 210, which extends longitudinally between two lateral ends of the third substrate 200, the heat conveying device 210 extending within the third substrate 200, as can be seen in FIGS. 2A and 2B. In particular, the heat conveying device 210 advantageously comprises at least one heat pipe (and preferably two heat pipes as shown in FIGS. 2A and 2B) passing through the third substrate 200 from a first longitudinal end to a second longitudinal end. This advantageous configuration makes it possible to extract heat produced by each electronic module 100 at the second substrate 140.

The third substrate 200 also comprises an electrical-connection lug 2005 projecting laterally out from the third substrate 200. The electrical-connection lug 2005 of the third substrate 200 has a rectangular shape.

In order to facilitate the connection of an electrical-connection wire, the electrical-connection lug 2005 of the third substrate 200 comprises a preferably circular through-opening 2006 positioned at a center of the electrical-connection lug 2005, as can be seen in the drawings.

The electronic modules 100 that form the electronic system 10 may be all identical or different, depending on the effects sought. In the following paragraphs and in the drawings, all the electronic modules 100 that form the electronic system 10 are all identical and assembled in a symmetrical configuration with respect to the third substrate 200.

Each electronic module 100 comprises:
a first heat-conducting and/or electrically conductive substrate 120;
a second electrically conductive substrate 140;
an electronic device 180 arranged between the two substrates 120, 140;
at least one thermal bridge 130 designed to transfer heat between the first substrate 120 and the second substrate 140, the at least one thermal bridge 130 being separate from the two substrates 120, 140, i.e. being mounted on and rigidly attached to the two substrates 120, 140.

In the example shown in the FIGURES, the electric module 100 comprises two thermal bridges 130, each thermal bridge 130 being positioned at a longitudinal end of the control module 100, in a symmetrical configuration with respect to a transverse middle axis of the electronic module 100.

As can be seen more specifically in FIGS. 2A and 2B, the first substrate 120 of the electronic module 100 according to the first aspect of the invention comprises an electrical insulator 122 sandwiched between:
a first electrically conductive coating 121 positioned on a first side of the electrical insulator 122, the first side being positioned on an opposite side from the electronic device 180 in relation to the first substrate 120; and
a second electrically conductive coating 123 positioned on a second side of the electrical insulator 122, the second side being positioned on the electronic-device 180 side.

Advantageously, in the embodiment shown in the drawings, the first electrically conductive coating 121 and the second electrically conductive coating 123 of the first substrate 120 are metal. Preferably, the first substrate 120 takes the form of a DBC or DBA substrate, as described above, and the first electrically conductive coating 121 and the second electrically conductive coating 123 of the first substrate 120 form metal surface tracks of the electrical insulator 122.

The electrical insulator 122 of the first substrate 120 advantageously takes the form of a dielectric plate made of an electrically insulating material, such as a ceramic or polyimide.

As can be seen in FIG. 2A, the second electrically conductive coating 123 of the first substrate 120 comprises:
a first portion 123a and a second portion 123c, each first portion 123a and second portion 123c being electrically insulated from one another. In other words, the first portion 123a and the second portion 123c of the second electrically conductive coating 123 of the first substrate 120 form two electrical tracks separate from one another;
a middle portion 123b positioned between the first portion 123a and the second portion 123c and electrically insulated from the first portion 123a and second portion 123c. In other words, the middle portion 123b forms an electrical track separate from the first portion 123a and the second portion 123c of the second electrically conductive coating 123 of the first substrate 120.

The first portion 123a of the second conductive coating 123 is positioned symmetrically with a first lateral portion 1211 of the first conductive coating 121 in relation to the electrical insulator 122 of the first substrate 120. In particular, the first portion 123a of the second conductive coating 123 and the first lateral portion 1211 of the first conductive coating 121 have a substantially perpendicular shape and extend laterally between the two lateral ends of the electrical module 100.

Advantageously, the first portion 123a of the second conductive coating 123 and the first lateral portion 1211 of the first conductive coating 121 extend vertically in line with the first thermal bridge 130 of the electronic module 100.

The second portion 123b of the second conductive coating 123 is positioned symmetrically with a second lateral portion 1213 of the first conductive coating 121 in relation to the electrical insulator 122 of the first substrate 120. In particular, the second portion 123b of the second conductive coating 123 and the second lateral portion 1213 of the first conductive coating 121 have a substantially perpendicular shape and extend laterally between the two lateral ends of the electrical module 100.

Advantageously, the second portion 123b of the second conductive coating 123 and the second lateral portion 1213 of the first conductive coating 121 extend vertically in line with the second thermal bridge 130 of the electronic module 100.

Advantageously, the first substrate 120 is planar. As a result, the first conductive coating 121, the second conductive coating 123 and the electrical insulator 122 are each advantageously planar.

As can be seen in FIG. 1A, the first portion 123a, the second portion 123c and the middle portion 123b of the second electrically conductive coating 123 of the first substrate 120 are all coplanar so as to facilitate the electrical connection to the electronic device 180.

In order to facilitate the electrical connection of the electronic module 100 to an electrical grid (not shown), the middle portion 123b of the second conductive coating 123 of the first substrate 120 comprises an electrical-connection lug 1235 projecting laterally out from the first substrate 120. In the example shown in the drawings, the electrical-connection lug 1235 of the middle portion 123*b* of the second conductive coating 123 of the first substrate 120 has a rectangular shape and comprises a through-opening 1236 in order to facilitate the connection of an electrical-connection wire, for example by brazing. The through-opening 1236 is advantageously circular and is positioned at a center of the electrical-connection lug 1235.

Unlike the first substrate 120, the second substrate 140 of the electronic module 100 comprises an electrically conductive coating 145, preferably a metal coating, made for example of copper. As a result, a first face of the second substrate 140 positioned on the side of the electronic-device 180 is at the same electrical potential as a second face of the second substrate 140 positioned on the opposite side from the electronic device 180 in relation to the second substrate 140. This advantageous configuration makes it possible to facilitate the electrical interconnection of the electronic module 100 to the third substrate 200 when the electronic module 100 is assembled in an electrical system 10 as described above.

On the side of the second face of the second substrate 140 of the electronic module 100 according to the first aspect of the invention, the electrically conductive coating 145 comprises a first portion 1411 and a second portion 1413 each positioned at a longitudinal end of the second substrate 140. Each first and second portion 1411, 1413 is electrically coupled to the other, the electrically conductive coating 145 of the second substrate 140 extending in a continuous manner between the two longitudinal ends of the second substrate 140. Additionally, the electrically conductive coating 145 also comprises, on the side of the second face of the second substrate 140 of the electronic module 100 according to the first aspect of the invention, a middle portion 1412 positioned between the first and second portions 1411, 1413. The middle portion 1412 is of course electrically coupled to the first and second portions 1411, 1413 due to the continuous nature of the electrically conductive coating 145 of the second substrate 140 between the two longitudinal ends thereof.

The electrically conductive coating 145 of the second substrate 140 comprises an electrical-connection lug 1405 projecting laterally out from the second substrate 140. The electrical-connection lug 1405 of the electrically conductive coating 145 of the second substrate 140 has a rectangular shape and comprises a through-opening 1406 in order to facilitate the connection of an electrical-connection wire.

Figure 1B:
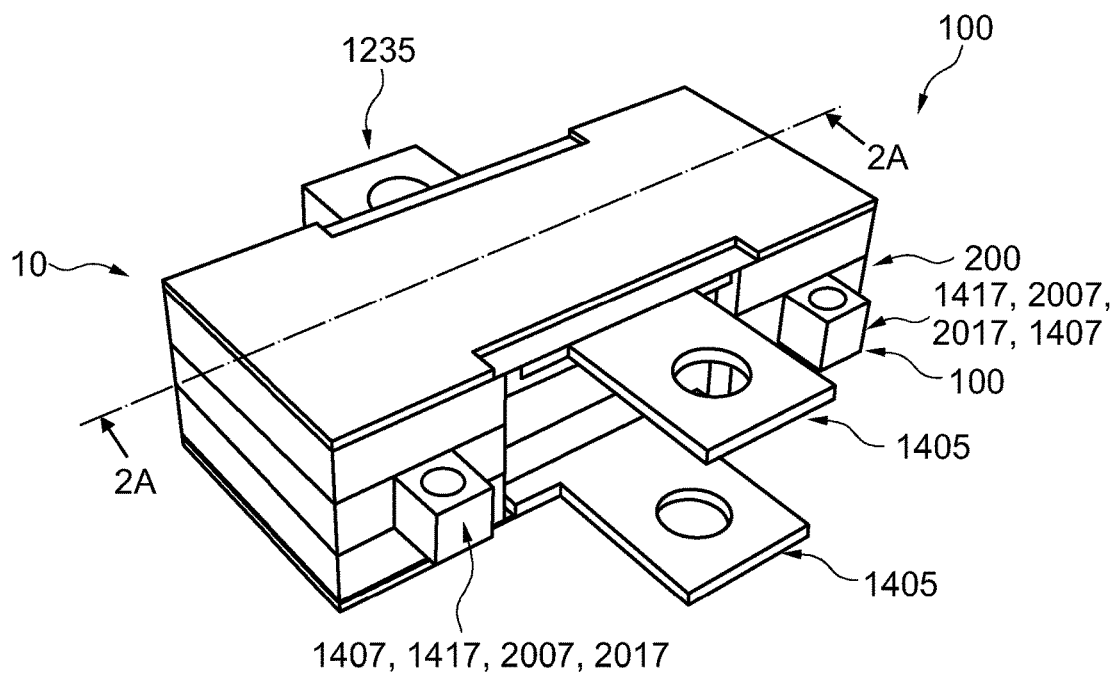
FIG. 1B illustrates a perspective view of the electronic system shown in FIG. 1A, in an assembled state.

As can be seen in FIGS. 1A and 1B, the electrical-connection lug 1405 of the electrically conductive coating 145 of the second substrate 140 extends in a lateral direction opposite to the electrical-connection lug 1235 of the middle portion 123*b* of the first substrate 120.

As described above, each electronic module 100 comprises at least one thermal bridge 130 in order to optimize the cooling of the electronic module 100 during the operation thereof. Advantageously, and as shown in the various figures, each electronic module 100 comprises:
  a first thermal bridge 130 positioned between the first portion 123*a* of the second conductive coating 123 of the first substrate 120 and a portion positioned facing the conductive coating 145 of the second substrate 140; and
  a second thermal bridge 130 positioned between the second portion 123*c* of the second conductive coating 123 of the first substrate 120 and another portion positioned facing the conductive coating 145 of the second substrate 140.

Each thermal bridge 130 of the electronic module 100 according to the first aspect of the invention is rigidly attached to the first substrate 120 and to the second substrate 140 by means of a brazed joint 150 or any other electrically conductive and/or heat-conducting material, the material being designed to make it possible to interconnect each thermal bridge 130 to the first substrate 120 and second substrate 140, respectively. This advantageous configuration makes it possible in particular to facilitate the assembly of the electronic module 100 by adjusting a thickness of an electrically conductive material or of a brazed joint, the thickness being viewed in a direction that is simultaneously perpendicular to the above-described longitudinal and transverse directions.

Each thermal bridge 130 is made of or comprises a heat-conducting material, so as to be able to establish effective heat conduction between the first substrate 120 and the second substrate 140. To do so, the heat-conducting material is preferably selected from among those having a thermal conductivity coefficient greater than or equal to 20 W/m/K at 20° C., such as copper or aluminum.

At the substrate positioned at a distance from the third substrate 200 of the electronic system 10, each electronic module 100 also comprises a heat sink 110 thermally coupled to the corresponding substrate. In other words, independently of the electronic system 10 according to the second aspect of the invention, the electronic module according to the first aspect of the invention comprises a heat sink 110 thermally coupled to the first substrate 120.

The thermal coupling between the heat sink 110 and the corresponding substrate is of the direct or indirect thermal coupling type, in particular by means of an intermediate material positioned between the first heat sink and the first substrate, the intermediate material being of the heat-conducting type, for example a thermal paste or a thermal glue.

In order to favor exchange of heat with the ambient air, and thus to optimize the cooling of the electronic module 100 and/or of the electronic system 10, the heat sink 110 is made of a heat-conducting material selected from among those having a thermal conductivity coefficient greater than or equal to 20 W/m/K at 20° C., such as metal materials, for example aluminum.

The electronic module 100 according to the first aspect of the invention thus forms a three-dimensional electronic module as described above. As a result, the electronic module 100 comprises the electronic device 180 between the first substrate 120 and second substrate 140.

Advantageously, and in particular in the field of power electronics, the electronic module 100 is arranged so as to function like a switch having two conduction states.

The electronic device 180 comprises a plurality of power components 181*a*-181*d*, such as at least one power transistor, in particular of the MOSFET, IGBT or GTO types as described above.

Together, the power components 181*a*-181*d* advantageously form, at least in part, an inverter and/or, at least in part, a bridge rectifier so as to be able to convert an AC voltage into a DC voltage or vice versa. In addition, the power components 181*a*-181*d* may together form a DC-DC converter.

In particular, in the electronic system 10 shown in the drawings, the electronic device 180 of each electronic module 100 forms a half-bridge of an inverter arm, the half-bridge of the first electronic module 100 being electrically connected to the corresponding half-bridge of the second electronic module 100 at an intermediate point that connects a first terminal of a power component 181*a*-181*d* of the first electronic module 100 to a second terminal of a second power component 181a-181d of the second electronic module 100. Even more particularly, in the case where the power component 181a-181d takes the form of a transistor, the first terminal of the power component 181a-181d is advantageously a source terminal and the second terminal of the power component 181a-181d is a drain terminal.

The power components 181a-181d of the electronic device 180 are thus interfaced by the substrates 120, 140 of the electronic module 100.

In particular, each electronic module 100 comprises an electrical-connection member 170 for supplying electricity to the terminals of at least some of the power components 181a-181d of the electronic device 180, the electrical-connection member 170 comprising a first electrical track 171 and a second electrical track 172.

The electrical-connection member 170 is rigidly attached to the first substrate 120, and in particular to the second conductive coating 123. Even more particularly, the electrical-connection member 170 is rigidly attached to the middle portion 123b of the second conductive coating 123.

The electronic power system 10 according to the second aspect of the invention is thus assembled by means of the various following steps:
  for each electronic module 100:
    producing the electronic device 180 on the first substrate 120 of the first electronic module 100;
    placing and attaching the at least one thermal bridge 130 onto the first substrate 120 of the electronic module 100;
    placing and attaching the second substrate 140 onto the at least one thermal bridge 130 and the electronic device 180;
  inserting the third substrate 200 in an intermediate position between two electronic modules 100 positioned on either side of the third substrate 200, the third substrate 200 being sandwiched between the two electronic modules 100;
  rigidly connecting the third substrate 200 to the electronic modules 100.

In order to rigidly connect the third substrate 200 to each electronic module 100, the third substrate 200 comprises complementary attachment means 2007 that interact with attachment means 1407 of the second substrate 140 of each electronic module 100.

The complementary attachment means 2007 of the third substrate 200 take the form of an attachment lug 2017 that projects laterally with respect to the third substrate 200. In the example shown in FIGS. 1A and 1B, the third substrate 200 comprises four attachment lugs 2017 positioned close to each corner of the third substrate 200. In particular, the third substrate 200 comprises (i) a first pair of attachment lugs 2017, each attachment lug 2017 of the first pair being positioned at one of the longitudinal ends of a first longitudinal edge of the third substrate 200, and (ii) a second pair of attachment lugs 2017, each attachment lug 2017 of the second pair being positioned at one of the longitudinal ends of a second longitudinal edge of the third substrate 200. Even more particularly, for each pair, the attachment lugs 2017 are positioned symmetrically with a lateral mid-plane of the third substrate 200, and each attachment lug 2017 of a first pair is positioned symmetrically with an attachment lug 2017 of the second pair in relation to a longitudinal mid-plane of the third substrate 200.

Advantageously, each attachment lug 2017 of the third substrate 200 comprises a through-opening 2008.

Similarly, the attachment means 1407 of the second substrate 140 of each electronic module 100 according to the first aspect of the invention preferably comprises at least one attachment lug 1417 projecting laterally with respect to the second substrate 140. In particular, each attachment lug 1417 is formed by a protuberance of the electrically conductive coating 145 of the second substrate 140.

In the example shown in FIGS. 1A and 1B, the second substrate 140 comprises four attachment lugs 1417 positioned close to each corner of the second substrate 140. In particular, the second substrate 140 comprises (i) a first pair of attachment lugs 1417, each attachment lug 1417 of the first pair being positioned at one of the longitudinal ends of a first longitudinal edge of the second substrate 140, and (ii) a second pair of attachment lugs 1417, each attachment lug 1417 of the second pair being positioned at one of the longitudinal ends of a second longitudinal edge of the second substrate 140. Even more particularly, for each pair, the attachment lugs 1417 are positioned symmetrically with a lateral mid-plane of the second substrate 140, and each attachment lug 1417 of a first pair is positioned symmetrically with an attachment lug 1417 of the second pair in relation to a longitudinal mid-plane of the second substrate 140.

Advantageously, each attachment lug 1417 comprises a through-opening 1418.

In order to facilitate the electrical interconnection of the electronic device 180, the electronic module 100 according to the first aspect of the invention comprises at least one connection stud 160 designed to establish an electrical connection between at least one connection terminal of the electronic device 180 and the second substrate 140.

The connection stud 160 is metal so as to favor electricity conduction.

Figure 3:
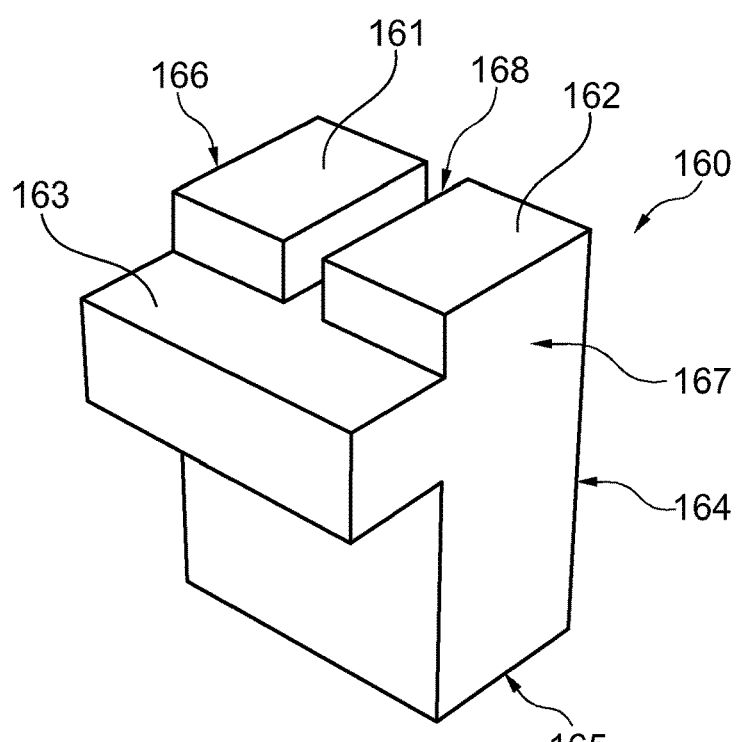
FIG. 3 illustrates a connection stud used to connect the electronic device to the second substrate of the electronic module according to the first aspect of the invention.

An example embodiment of a connection stud 160 of this kind is shown in FIG. 3.

The connection stud 160 has a general prismatic shape and comprises a rectangular base 168 in the example shown in FIG. 3. However, the shape of the base 168 may be any given shape depending on the installation of the electronic device 180 and/or of the electronic components 181a-181d with which the connection stud 160 interacts. The connection stud 160 is thus delimited laterally between a first and a second lateral face 166, 167. In a direction perpendicular to its base 168, the connection stud extends as far as to an electrical-connection face 165 positioned at an opposite end from the base 168 of the connection stud 160 in order to establish an electrical and/or thermal connection to the second substrate 140 of the electronic module 100 according to the first aspect of the invention.

The base 168 of the connection stud 160 comprises two contact terminals 161, 162, each contact terminal 161, 162 making it possible to establish an electrical connection with a corresponding connection terminal of the electronic device 180 with which the connection stud 160 interacts.

At their free end, the contact terminals 161, 162 form a connection surface in order to be rigidly connected, possibly by means of a bonding material, to a corresponding terminal of the electronic device 180.

In the example shown in FIG. 3, the connection surfaces of the contact terminals 161, 162 are planar and coplanar. Equally, the electrical-connection face 165 is planar and parallel to the contact terminals 161, 162 of the connection stud 160. The contact terminals 161, 162 project with respect to a prismatic extension of the connection stud 160 and with respect to the base 168 thereof, each contact terminal 161, 162 having a prismatic shape.

The connection stud 160 shown in FIG. 3 also comprises an electrical-connection tab 163 projecting with respect to a face of the connection stud 160. In particular, the electrical-connection tab 163 extends between the two lateral faces 166, 167 of the connection stud 160 and in a direction that is simultaneously perpendicular to a direction normal to the lateral faces of the connection stud 160 and perpendicular to a direction normal to the base 168 of the electrical-connection stud 160. In other words, the electrical-connection tab takes the form of a prismatic extension that projects between the two lateral faces 166, 167 of the connection stud 160. The electrical-connection tab 163 thus makes it possible to facilitate the electrical connection of the electronic device 180 to the second substrate 140 of the electronic module 100 according to the first aspect of the invention, in particular by facilitating the electrical connection (by bonding) of one connection terminal of the electronic device 180 to the electrical-connection tab 163 of the connection stud 160.

In summary, the invention relates in particular to a three-dimensional electronic module 100 comprising an electronic device 180 housed between a first substrate 120 and a second substrate 140, the first substrate 120 and second substrate 140 being electrically and/or thermally connected to one another by at least one, and preferably two, thermal bridges 130 mounted on and rigidly connected to the first substrate 120 and second substrate 140. The invention also relates to an electronic system 10 comprising at least two electronic modules 100 mounted facing one another so as to sandwich a third substrate 200 in contact with the second substrate 140 thereof, respectively. The third substrate 200 is configured to provide thermal and electrical coupling between the two electronic modules 100 by means of the second substrate 140 thereof.

It goes without saying that the invention is not limited to the examples that have just been described, and that numerous variations may be made to these examples without departing from the scope of the invention. In particular, the different features, forms, variants and embodiments of the invention may be combined with one another in various combinations, unless they are incompatible with one another or mutually exclusive. In particular, all the variants and embodiments described above may be combined.

The invention claimed is:

1. An electronic power system comprising:
   a first electronic module and a second electronic module, the first and the second electronic modules each comprising a first heat-conducting substrate, a second electrically conductive substrate, an electronic device arranged between the two substrates, at least one thermal bridge designed to transfer heat between the first substrate and the second substrate, the at least one thermal bridge being separate from the two substrates; and
   a third substrate thermally; said third substrate being in the form of a plate sandwiched between the first and second electronic modules and being electrically coupled to:
      the second substrate of the first electronic module; and
      the second substrate of the second electronic module.

2. The electronic power system according to claim 1, wherein each of said electronic modules comprises at least one connection stud designed to establish an electrical and/or thermal connection between at least one connection terminal of the electronic device and the second substrate.

3. The electronic power system according to claim 2, wherein the at least one connection stud comprises a base on which at least one contact terminal is positioned, the at least one contact terminal being designed to establish an electrical connection with a corresponding connection terminal of the electronic device.

4. The electronic power system according to claim 2, wherein the at least one connection stud comprises an electrical-connection tab projecting with respect to a face of said at least one connection stud.

5. An electronic power system comprising:
   a first electronic module and a second electronic module, the first and the second electronic modules each comprising a first heat-conducting substrate, a second electrically conductive substrate, an electronic device arranged between the two substrates, at least one thermal bridge designed to transfer heat between the first substrate and the second substrate, the at least one thermal bridge being separate from the two substrates; and
   a third substrate thermally and electrically coupled to:
      the second substrate of the first electronic module; and
      the second substrate of the second electronic module;
   wherein the first substrate of the electronic module comprises:
      an electrical insulator;
      a first electrically conductive coating positioned on a first side of the electrical insulator, said first side being positioned on an opposite side from the electronic device in relation to the first substrate;
      a second electrically conductive coating positioned on a second side of the electrical insulator, said second side being positioned on the electronic-device side and comprising:
         a first portion and a second portion, each first and second portion being electrically insulated from one another at the level of the second electrically conductive coating of the first substrate; and
         a middle portion positioned between the first and second portions and electrically insulated from the first and second portions at the level of the second electrically conductive coating of the first substrate.

6. An electronic power system comprising:
   a first electronic module and a second electronic module, the first and the second electronic modules each comprising a first heat-conducting substrate, a second electrically conductive substrate, an electronic device arranged between the two substrates, at least one thermal bridge designed to transfer heat between the first substrate and the second substrate, the at least one thermal bridge being separate from the two substrates; and
   a third substrate thermally and electrically coupled to:
      the second substrate of the first electronic module; and
      the second substrate of the second electronic module;
   wherein the second substrate comprises an electrically conductive coating, a first face of said second substrate positioned on the electronic-device side being at the same electrical potential as a second face of the second substrate positioned on the opposite side from said electronic device in relation to said second substrate, said electrically conductive coating of the second substrate comprising:
      a first portion and a second portion, each first and second portion being electrically coupled to one another at the level of the electrically conductive coating of the second substrate; and
      a middle portion positioned between the first and second portions and electrically coupled to the first and second portions at the level of the electrically conductive coating of the second substrate.

7. The electronic power system according to claim 6, wherein the at least one thermal bridge comprises:
- a first thermal bridge positioned between the first portion of the second conductive coating of the first substrate and the first portion of the conductive coating of the second substrate; and
- a second thermal bridge positioned between the second portion of the second conductive coating of the first substrate and the second portion of the conductive coating of the second substrate.

8. The electronic power system according to claim 1, said electronic module comprising a first heat sink thermally coupled to the first substrate.

9. The electronic power system according to claim 8, wherein the third substrate comprises a device for conveying heat from a hot point to a cold point, said heat conveying device comprising at least one heat pipe passing through the third substrate from a first end to a second end.

10. The electronic power system according to claim 8, wherein the electronic device of each electronic module forms a half-bridge of an inverter arm, the half-bridge of the first electronic module being electrically connected to the corresponding half-bridge of the second electronic module at an intermediate point.

11. Method for assembling an electronic power system according to claim 1, said assembly method comprising the following steps:
for each electronic module:
- producing the electronic device on the first substrate of the first electronic module;
- placing and attaching the at least one thermal bridge onto the first substrate of the first electronic module;
- placing and attaching the second substrate onto the at least one thermal bridge and the electronic device;

inserting the third substrate in an intermediate position between two electronic modules that form a pair and are positioned on either side of the third substrate, said third substrate being sandwiched between the two electronic modules that form said pair;

rigidly connecting the third substrate to the electronic modules.

12. The electronic power system according to claim 1 wherein said third substrate is made of a heat-conducting and electrically conductive material.

* * * * *